(12) United States Patent
Chen

(10) Patent No.: US 8,934,247 B2
(45) Date of Patent: Jan. 13, 2015

(54) FASTENER

(75) Inventor: Tsung-Ming Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 247 days.

(21) Appl. No.: 13/598,653

(22) Filed: Aug. 30, 2012

(65) Prior Publication Data

US 2014/0055955 A1 Feb. 27, 2014

(30) Foreign Application Priority Data

Aug. 22, 2012 (TW) .............................. 101130551 A

(51) Int. Cl.
*H05K 7/20* (2006.01)

(52) U.S. Cl.
USPC ........... 361/704; 361/688; 361/690; 361/719; 411/508; 165/80.3; 257/719

(58) Field of Classification Search
None
See application file for complete search history.

(56) References Cited

U.S. PATENT DOCUMENTS

| | | | | |
|---|---|---|---|---|
| 5,730,210 A * | 3/1998 | Kou | .............................. | 165/80.3 |
| 6,105,215 A * | 8/2000 | Lee | ................. | 24/458 |
| 6,112,378 A * | 9/2000 | Lee | ................. | 24/458 |
| 6,752,577 B2 * | 6/2004 | Chen et al. | ..................... | 411/508 |
| 7,167,370 B2 * | 1/2007 | Lee et al. | ....................... | 361/719 |
| 7,218,525 B2 * | 5/2007 | Lo et al. | ........................ | 361/719 |
| 7,382,618 B2 * | 6/2008 | Peng et al. | ................... | 361/715 |
| 8,144,470 B2 * | 3/2012 | Maloney | ...................... | 361/719 |
| 8,316,923 B2 * | 11/2012 | Yang | ............................. | 165/121 |
| 2003/0159819 A1* | 8/2003 | Lee | ................. | 165/185 |
| 2008/0192440 A1* | 8/2008 | Meng et al. | ................... | 361/719 |

\* cited by examiner

*Primary Examiner* — Boris Chervinsky
(74) *Attorney, Agent, or Firm* — Novak Druce Connolly Bove + Quigg LLP

(57) ABSTRACT

A fastener includes a main body, a washer, and a spring. The main body includes a pole, two spaced latches extending from a top end of the pole, and two spaced legs extending down from a bottom end of the pole opposite to the latches. An annular blocking portion protrudes out from a circumference of the pole adjacent to the legs. A tapered first projection protrudes from an outer side of a distal end of each latch opposite to the other latch. A tapered second projection protrudes from an outer side of a distal end of each leg opposite to the other leg. The washer and the spring are fitted around the pole, and the spring is sandwiched between the washer and the blocking piece.

2 Claims, 2 Drawing Sheets

FASTENER

BACKGROUND

1. Technical Field

The present disclosure relates to a fastener.

2. Description of Related Art

Screws are generally needed in mounting a heat sink to a circuit board. However, screws often have an enlarged head and need a screwdriver to be installed. As a result, some fins of the heat sinks may need to be cutoff to provide enough space to install the screws, which is tedious and reduces the heat dissipation area.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
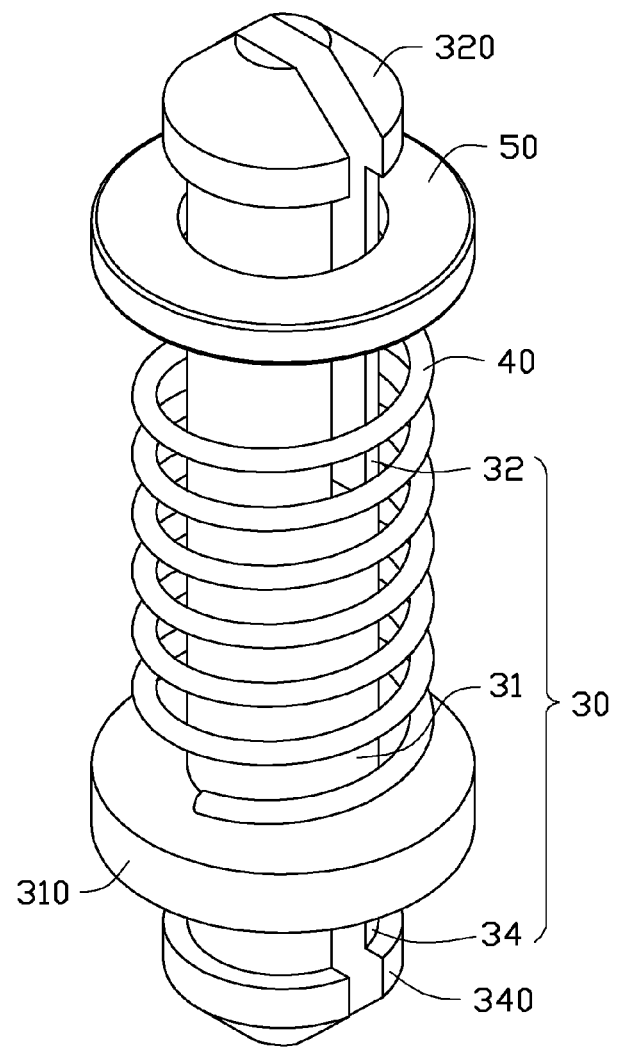
FIG. 1 is an isometric view of an exemplary embodiment of a fastener.
Figure 2:
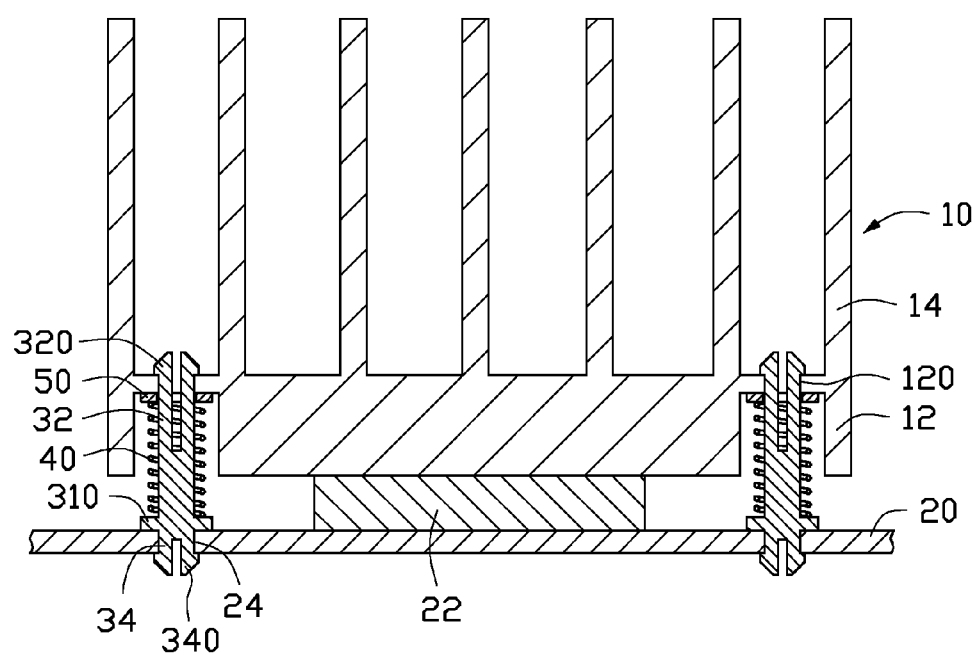
FIG. 2 is a cross-sectional view showing two fasteners of FIG. 1 mounting a heat sink to a circuit board.

Referring to FIGS. 1 and 2, an exemplary embodiment of a fastener is provided for mounting a heat sink 10 to a circuit board 20.

An electronic element 22, such as a central processing unit, is mounted on the circuit board 20. The circuit board 20 defines two through holes 24, respectively at opposite sides of the electronic element 22.

The heat sink 10 includes a base 12 and a plurality of fins 14 perpendicularly extending up from the base 12. The base 12 defines two fixing holes 120, each fixing hole 120 is located between two adjacent fins 14.

The fastener includes a main body 30, a spring 40, and a washer 50. The main body 30 includes a pole 31, two spaced latches 32 extending up from a top end of the pole 31, two spaced legs 34 extending down from a bottom end of the pole 31 opposite to the latches 32. An annular blocking portion 310 protrudes out from the pole 31 adjacent to the legs 34. A tapered first projection 320 protrudes from an outer side of a distal end of each latch 32, opposite to the other latch 32. A tapered second projection 340 protrudes from an outer side of a distal end of each leg 34, opposite to the other leg 34. The washer 50 and the spring 40 are fitted around the pole 31, and the spring 40 is sandwiched between the washer 50 and the blocking piece 310.

In assembly, the heat sink 10 is rested on the electronic element 22. Two of the fasteners are provided to mount the heat sink 10 to the circuit board 20. The latches 32 of each fastener are deformed toward each other, to allow the first projections 320 to extend through one of the fixing holes 120 from bottom to top, until the first projections 320 extend out of the corresponding fixing hole 120. The latches 32 are restored, thereby the first projections 320 sandwiches the base 12 together with the corresponding washer 50. The legs 34 of each fastener are deformed toward each other, to allow the second projections 340 to extend through one of the through holes 24 from top to bottom, until the second projections 340 extend out of the corresponding through hole 24. The legs 34 are restored, thereby the second projections 340 sandwiches the circuit board 20 together with the corresponding blocking piece 310.

When uninstalling the heat sink 10, the second projections 340 of each fastener are pressed toward each other and are then disengaged from the corresponding through hole 24, the heat sink 10 is readily disengaged from the circuit board 20.

As the latches 32 of each fastener are capable of engaging in the base 12 from bottom to top, the fins 14 needs not to be cutoff to provide a space to fix the fastener.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A fastener, comprising:
   a main body comprising a pole, two spaced latches extending from a top end of the pole, two spaced legs extending down from a bottom end of the pole opposite to the latches; a blocking portion protruding out from the pole adjacent to the legs, a tapered first projection protruding from an outer side of a distal end of each latch opposite to the other latch, a tapered second projection protruding from an outer side of a distal end of each leg opposite to the other leg;
   a washer fitted around the pole; and
   a spring fitted around the pole and sandwiched between the washer and the blocking piece.

2. An assembly, comprising:
   a circuit board defining a through hole;
   a heat sink comprising a base and a plurality of fins extending from the base, the base defining a fixing hole; and
   a fastener comprising a pole, two spaced latches extending from a top end of the pole, and two spaced legs extending down from a bottom end of the pole opposite to the latches; a blocking portion protruding out from the pole adjacent to the legs, a tapered first projection protruding from an outer side of a distal end of each latch opposite to the other latch, a tapered second projection protruding from an outer side of a distal end of each leg opposite to the other leg; wherein a washer is fitted around the pole; a spring is fitted around the pole and sandwiched between the washer and the blocking piece;
   wherein the latches extend through the fixing hole of the heat sink, the first projection and the washer sandwich the base, the legs extend through the through hole, the blocking portion and the second projection sandwich the circuit board.

* * * * *